United States Patent [19]

Diller et al.

[11] Patent Number: 4,723,112
[45] Date of Patent: Feb. 2, 1988

[54] LEVEL SHIFT CIRCUIT FOR DIFFERENTIAL SIGNALS

[75] Inventors: Calvin D. Diller, Hillsboro; Donald D. Gladden, Portland, both of Oreg.

[73] Assignee: Tektronix, Inc., Beaverton, Oreg.

[21] Appl. No.: 909,653

[22] Filed: Sep. 19, 1986

[51] Int. Cl.⁴ .............................................. H03F 3/45
[52] U.S. Cl. .................................... 330/258; 330/260
[58] Field of Search .................. 330/69, 84, 107, 258, 330/259, 260, 294

[56] References Cited

U.S. PATENT DOCUMENTS 3,500,223  3/1970  Thurnell .................... 330/260 X

FOREIGN PATENT DOCUMENTS 203009 10/1985 Japan .................................... 330/258

Primary Examiner—James B. Mullins
Attorney, Agent, or Firm—John Smith-Hill

[57] ABSTRACT

A level shift circuit for shifting the common mode level of the output signal provided by a differential amplifier has first and second input terminals for receiving the output signal from the differential amplifier, which has a Thevenin source impedance $R_s$, and also has first and second output terminals that are connected to a reference voltage level through a load impedance $R_o$. The circuit comprises a differential transconductance amplifier having two output terminals that are connected respectively to the first and second output terminals of the circuit. The amplifier has the property that it responds to an input voltage $E_e$ between its input terminals by providing a current equal to $E_e g_{ml}/(1+\tau s)$ (where $g_{ml}$ is the transconductance of the amplifier, $\tau$ is the response time constant of the amplifier and s is the Laplace transform operator) at its output terminals. Two equal-valued capacitors are connected respectively between the first input terminal of the circuit and the first output terminal of the circuit and between the second input terminal of the circuit and the second output terminal of the circuit, the capacitance $C_c$ of each capacitor being such that $R_s C_c$ is much greater than $\tau$. The circuit also comprises two equal-valued resistors connected in series between the first input terminal of the circuit and the second output terminal of the circuit and having their connection point connected to one of the input terminals of the amplifier, and two more equal-valued resistors connected in series between the first output terminal of the circuit and the second input terminal of the circuit and having their connection point connected to the other of the two input terminals of the amplifier. The value of $g_{ml}$ is selected to be equal to $(\frac{1}{2}R_s + 1/R)$.

2 Claims, 3 Drawing Figures

LEVEL SHIFT CIRCUIT FOR DIFFERENTIAL SIGNALS

This invention relates to a level shift circuit for differential signals.

BACKGROUND OF THE INVENTION

High speed differential amplifiers of conventional design, such as those which are used in the vertical channel of a cathode ray oscilloscope, are able to provide an output signal that is an accurate replica of the input signal for a wide range of frequencies, e.g., from DC up to more than 1 Ghz. It is conventional for the vertical amplifier of an oscilloscope to use several differential amplifier stages in cascade, in order to provide the desired amount of voltage gain.

A characteristic of conventional differential amplifiers is that the common mode level of the output signal of the amplifier is several volts, e.g. 3 to 4 volts, higher than the common mode level of the input signal. Therefore, when three differential amplifier stages are connected in cascade, there is a common mode level shift of from 9 to 12 volts between the input of the first amplifier stage and the output of the last amplifier stage, unless level shifting circuits are interposed between the successive stages. This offset in the common mode level of the conventional differential amplifier can present a problem, since each stage requires different supply voltages. Furthermore, the different supply voltages may make it impractical to fabricate several stages on the same integrated circuit chip because of breakdown voltage limitations. Conventional level shifting circuits consume large amounts of power, requiring expensive packaging to remove the resulting heat. Also, if the oscilloscope is to operate in the internal trigger mode, in which the trigger for controlling horizontal deflection is generated by comparing the vertical deflection signal with a predetermined trigger level, it is necessary to compensate for the offset in common mode level if the vertical deflection signal is to be applied to the trigger comparator from any location other than upstream of the vertical amplifier.

SUMMARY OF THE INVENTION

A preferred embodiment of the present invention is a level shift circuit for shifting the common mode level of the output signal provided by a differential amplifier. The circuit has first and second input terminals for receiving the output signal from the differential amplifier, which has a Thevenin source impedance $R_s$. The circuit also has first and second output terminals that are connected to a reference voltage level through a load impedance $R_o$. The circuit comprises a differential transconductance amplifier having two input terminals and two output terminals, the two output terminals being connected respectively to the first and second output terminals of the circuit. The amplifier has the property that it responds to an input voltage $E_e$ between its input terminals by providing a current equal to $E_e g_{m1}/(1+\tau s)$ (where $g_{m1}$ is the transconductance of the amplifier, $\tau$ is the response time constant of the amplifier and s is the Laplace transform operator) at its output terminals. Two equal-valued capacitors are connected respectively between the first input terminal of the circuit and the first output terminal of the circuit and between the second input terminal of the circuit and the second output terminal of the circuit, the capacitance $C_c$ of each capacitor being such that $R_s C_c$ is much greater than $\tau$. The circuit also comprises four equal-valued resistors, the resistance value R of each of which is much greater than $R_s$ and $R_o$. Two of the resistors are connected in series between the first input terminal of the circuit and the second output terminal of the circuit and have their connection point connected to one of the input terminals of the amplifier. The other two resistors are connected in series between the first output terminal of the circuit and the second input terminal of the circuit and have their connection point connected to the other of the two input terminals of the amplifier. The value of $g_{m1}$ is selected to be equal to $(1/2R_s + 1/R)$.

BRIEF DESCRIPTION OF THE DRAWING

For a better understanding of the invention, and to show how the same may be carried into effect, reference will now be made, by way of example, to the accompanying drawing in which.

DETAILED DESCRIPTION

Figure 1:
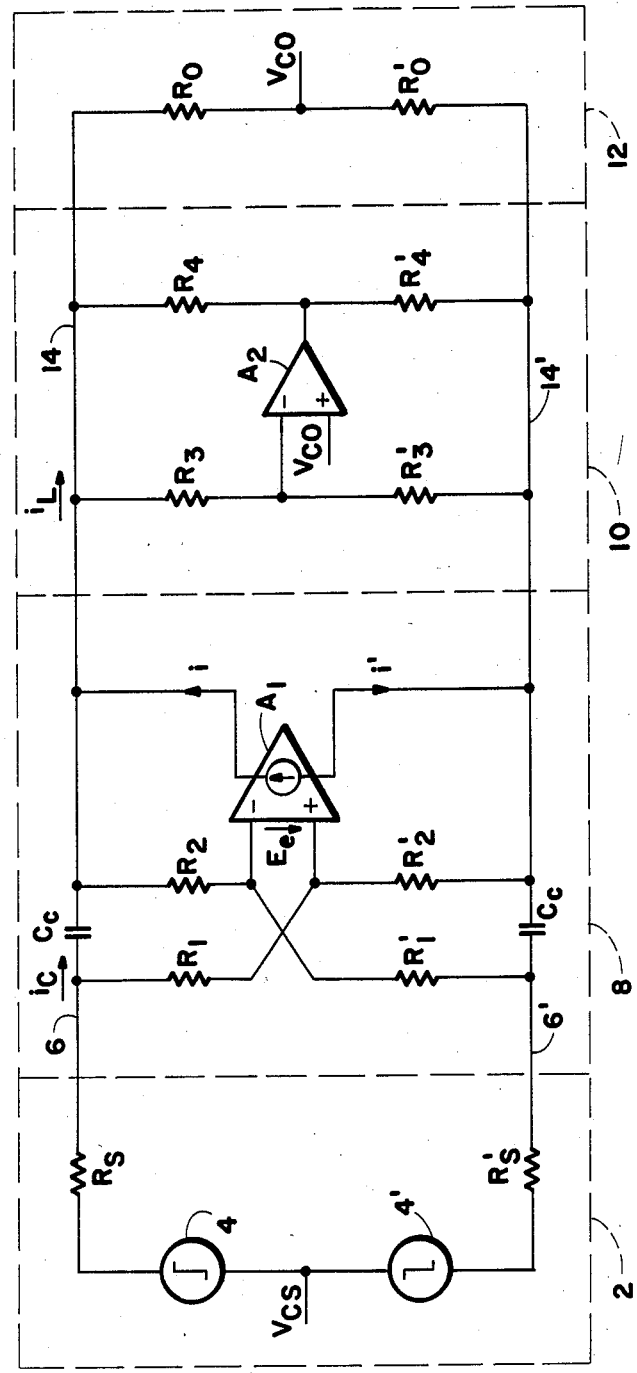
FIG. 1 is a block diagram of a circuit that includes as one stage a level shift circuit embodying the present invention.

The circuit illustrated in FIG. 1 comprises a differential amplifier 2 that is illustrated schematically as two Thevenin voltages sources 4 and 4' that are connected in series with respective source impedances $R_s$ and $R_s'$ between a source common mode voltage level $V_{cs}$ and circuit nodes 6 and 6'. A differential voltage signal is developed between the nodes 6 and 6'.

The nodes 6 and 6' are connected to a level shift circuit 8. The level shift circuit transmits differential signals faithfully while providing a U high common mode DC resistance across capacitors $C_c$ and $C_c'$ in order to allow a large common mode voltage drop with low common mode current and power dissipation.

A common mode correction amplifier 10 is used to drive the common mode level of the differential signal provided by the level shift circuit to a desired output common mode level $V_{co}$. The output terminals of the amplifier 10 are connected to a load 12 that is represented schematically as output impedances $R_o$ and $R_o'$ connected between the output terminals of the amplifier 10 and a reference potential level, e.g. $V_{co}$.

Figure 2:
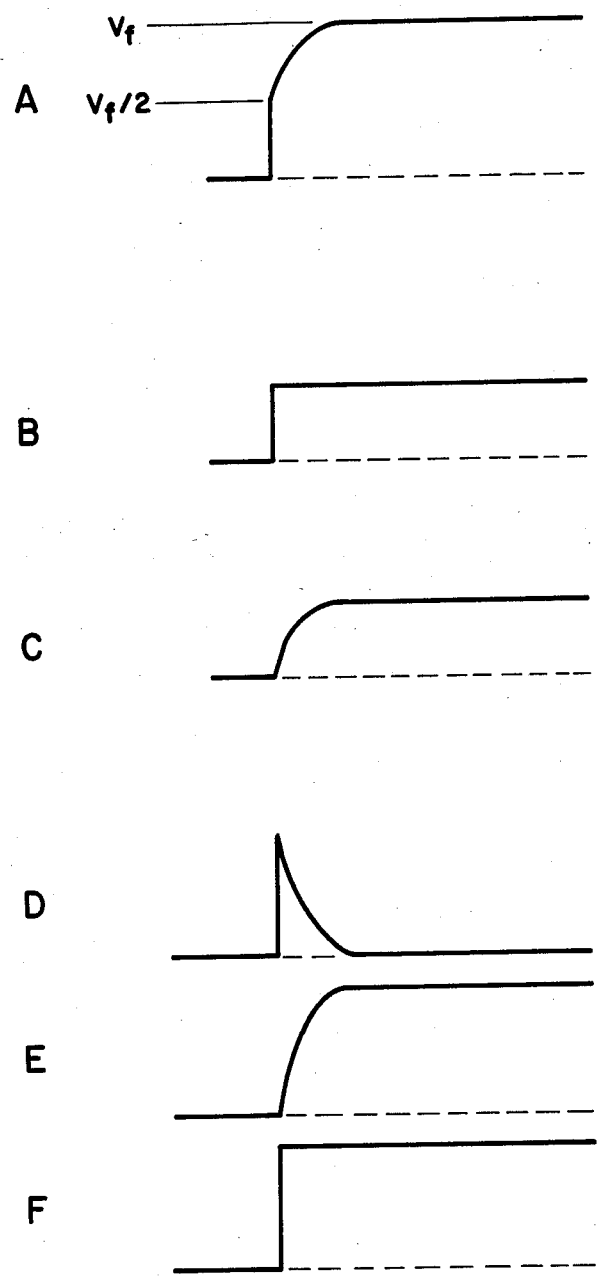
FIG. 2 shows waveforms that are useful in explaining operation of the FIG. 1 circuit.

If a rectangular voltage transition is generated by Thevenin sources 4 and 4', the voltage between the nodes 6 and 6' initially rises in step fashion and then rises in accordance with an inverse exponential function as the capacitors $C_c$ and $C_c'$ are charged through the source impedances $R_s$ and $R_s'$. The source impedances $R_s$ and $R_s'$ are approximately equal to the output impedances $R_o$ and $R_o'$, and therefore the value $V_f$ at which the voltage between the nodes 6 and 6' stabilizes is twice the magnitude of the initial step change. See the waveform A shown in FIG. 2.

In the brief interval immediately after the rising edge of the step change, the the highest frequency components of the step change are passed directly by the capacitors $C_c$ and $C_c'$ to the load 12. Therefore, the current $i_c$ supplied through capacitor $C_c$ increases and the voltage at the node 14 rises sharply to a level determined by the voltage at the node 6, reduced by the loading effects of the resistors $R_1$, $R_2$, $R_3$, $R_4$ and $R_o$ on $R_s$. Symmetry considerations dictate that the voltage at the node 14' varies in equal and opposite fashion. See waveform B.

When the high frequency components of the step change have decayed, the current $i_c$ settles to zero. The value $V_f$ at which the voltage between the nodes 6 and 6' stabilizes is different from the voltage between the nodes 14 and 14'. Since the resistors $R_1$, $R_2$, $R_1'$ and $R_2'$ are equal valued, the voltage $E_e$ between the input terminals of the differential transconductance amplifier $A_1$ is equal to half the difference between the voltage between the nodes 6 and 6' and the voltage between the nodes 14 and 14' as shown by the steady-state level of the waveform C. The transconductance of the amplifier $A_1$ is set equal to $(1/2R_s+1/R_1)$, and therefore, the current i provided by the amplifier $A_1$ to the resistors $R_2$, $R_3$, $R_4$ and $R_o$ is given by $i=E_e(R_1+2R_s)/2R_sR_1(1+\tau s)$ where $\tau$ is the response time constant off the amplifier $A_1$ and s is the Laplace transform operator, and is exactly the same as the current $i_c$ that was provided through the capacitor $C_c$ just after the leading edge of the transition. Compare waveforms D and E.

It can be shown that for all intermediate times the output signal developed between the nodes 14 and 14' matches the voltage applied between the nodes 6 and 6' modified by a constant, and consequently that the level shift circuit provides high-fidelity transmission of the differential signal. It will be appreciated that the net load current $i_L$ (waveform F) is equal to the sum of i and $i_c$ and varies in step fashion in response to the rectangular voltage transition generated by the sources 4 and 4'. In the steady state, the entire load current $i_L$ is provided by the amplifier $A_1$.

The output impedance that is presented to the load 12 is constant over frequency and is equal to $R_s$ in parallel with $R_1$, $R_2$, $R_3$ and $R_4$.

The amplifier $A_2$ of the common mode correction stage is a high gain amplifier which senses the output common mode level through the resistors $R_3$ and $R_3'$ and drives it to match $V_{co}$ through the resistors $R_4$ and $R_4'$. If $V_{co}$ is set to signal ground, then the signal at the node 14 is a singleended ground-referenced signal and may be applied, for example, to a trigger level comparator.

Figure 3:
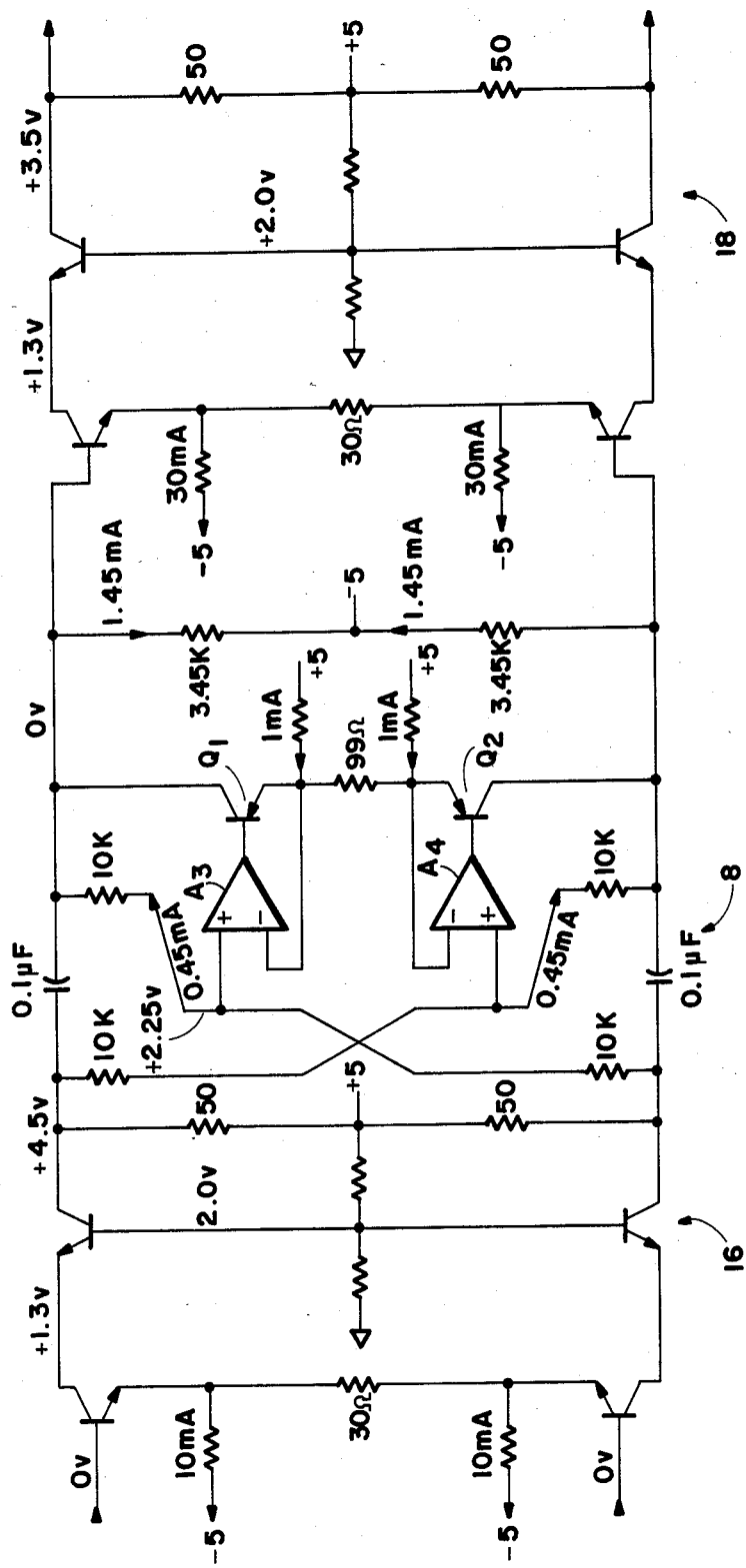
FIG. 3 is a schematic diagram illustrating an implementation of the FIG. 1 level shift circuit connected between two differential amplifiers.

FIG. 3 illustrates how the level shift circuit of FIG. 1 may be connected between two similar differential amplifier stages 16 and 18. Voltage levels and current values are marked in FIG. 3, as are component values. In the case of FIG. 3, the transconductance amplifier $A_1$ is implemented as two low cost operational amplifiers $A_3$ and $A_4$ driving respective current source transistors $Q_1$ and $Q_2$. The two amplifier stages 16 and 18 operate from the same supply voltages, simplifying system design and minimizing power dissipation.

There is no theoretical limit on the frequency of the signal components that can be passed by the FIG. 1 level shift circuit, since the only components of the level shift circuit that are in series with the signal path are capacitors. Frequency limits are imposed only by the source impedance $R_s$, $R_s'$ and the accumulated shunt capacitance to ground resulting from the circuit layout and the load. The only practical speed limit is imposed by the physical size of the capacitors $C_c$ and $C_c'$.

The response time constant $\tau$ of the amplifier $A_1$ need not be particularly small: it is necessary only that $\tau$ be much smaller than the coupling time constant $R_s C_c$.

Provided this requirement is satisfied, the output current i of the amplifier $A_1$ will follow the input voltage $E_e$ with only minuscule error.

It is not essential that the values of $C_c$ and $C_c'$ be precisely equal, so long as they do not differ from one another by more than about 20%. It is, however, important that the values of $R_1$, $R_1'$, $R_2$ and $R_2'$ be well matched, since if they are not, the response flatness errors will appear with time constants equal to T, to $R_sC_c$. In order to minimize deviation from flat pulse response, it is desirable to minimize capacitive coupling between the outputs of the amplifier $A_1$ and the inputs thereof.

It will be appreciated that the present invention is not restricted to the particular embodiment that has been described and illustrated, and that variations may be made therein without departing from the scope of the invention as defined in the appended claims. In particular, it is not essential to use the common mode correction amplifier in conjunction with the level shift circuit, the common mode correction amplifier being required only if the common mode impedance provided by the load is to high.

We claim:

1. A circuit for receiving a differential input signal from a source having a Thevenin source impedance $R_s$ and for applying an output signal to a load having an impedance $R_o$, the circuit having first and second input terminals for receiving the differential input signal and first and second output terminals for connection to the load and comprising a differential transconductance amplifier having two input terminals and two output terminals, the two output terminals being connected respectively to the first and second output terminals of the circuit, and the amplifier having the property that it responds to an input voltage $E_e$ between its input terminals by providing a current equal to $E_e g_{m1}/(1+\tau s)$ where $g_{m1}$ is the transconductance of the amplifier, $\tau$ is the response time constant of the amplifier, and s is the Laplace transform operator, at its output terminals, and the circuit also comprising first and second substantially equal-valued capacitors connected respectively between the first input terminal of the circuit and the first output terminal of the circuit and between the second input terminal of the circuit and the second output terminal of the circuit, the capacitance $C_c$ of each capacitor being such that $R_s C_c$ is much greater than $\tau$, and four equal-valued resistors connected respectively between the first input terminal of the circuit and one of the two input terminals of the amplifier, between the second input terminal of the circuit and the other of the two input terminals of the amplifier, between the first output terminal of the circuit and said other input terminal of the amplifier and between the second output terminal of the circuit and said one input terminal of the amplifier, the transconductance of the amplifier being equal to $(1/2R_s+1/R)$, where R is the resistance value of the four equal-valued resistors and is much greater than $R_o$.

2. A circuit according to claim 1, further comprising a common mode correction amplifier stage connected between the first and second output terminals of the circuit, the common mode correction amplifier stage comprising a high gain amplifier having a non-inverting input terminal connected to a desired common mode reference potential level and also having an inverting input terminal and an output terminal, a first pair of equal-valued resistors connected in series between the output terminals of the circuit and having a connection point that is connected to the inverting input terminal of the differential amplifier, and a second pair of equal-valued resistors connected in series between the output terminals of the circuit and having a connection point that is connection to the output terminal of the differential amplifier.

* * * * *